(12) United States Patent
Maruyama et al.

(10) Patent No.: US 8,159,250 B2
(45) Date of Patent: Apr. 17, 2012

(54) TESTING DEVICE FOR TESTING A SEMICONDUCTOR DEVICE

(75) Inventors: Yuji Maruyama, Shinjuku (JP);
Kazuhiro Tashiro, Shinjuku (JP);
Kazuhiko Shimabayashi, Shinjuku (JP);
Shigeru Goto, Shinjuku (JP); Takayuki Nakashiro, Shinjuku (JP); Susumu Koshinuma, Shinjuku (JP); Masayoshi Shirakawa, Akiruno (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/500,895

(22) Filed: Jul. 10, 2009

(65) Prior Publication Data

US 2009/0267630 A1 Oct. 29, 2009

Related U.S. Application Data

(63) Continuation of application No. PCT/JP2007/056598, filed on Mar. 28, 2007.

(51) Int. Cl.
*G01R 31/00* (2006.01)
(52) U.S. Cl. .............. 324/756.03; 324/754.07
(58) Field of Classification Search ........... 324/754–762
See application file for complete search history.

(56) References Cited

U.S. PATENT DOCUMENTS

| | | | | |
|---|---|---|---|---|
| 4,516,072 A | * | 5/1985 | Marpoe, Jr. | 324/754 |
| 4,799,009 A | * | 1/1989 | Tada et al. | 324/756 |
| 5,355,079 A | * | 10/1994 | Evans et al. | 324/754 |
| 5,623,214 A | * | 4/1997 | Pasiecznik, Jr. | 324/754 |
| 5,917,330 A | * | 6/1999 | Miley | 324/762 |
| 5,982,184 A | * | 11/1999 | Hasegawa | 324/754 |
| 6,144,212 A | * | 11/2000 | Mizuta | 324/754 |
| 6,275,051 B1 | * | 8/2001 | Bachelder et al. | 324/754 |
| 6,462,569 B2 | * | 10/2002 | Chen | 324/754 |
| 6,734,691 B2 | * | 5/2004 | Saijyo et al. | 324/762 |
| 6,864,696 B2 | * | 3/2005 | Logelin et al. | 324/754.07 |
| 6,879,180 B2 | * | 4/2005 | Iwata et al. | 324/770 |
| 6,882,168 B2 | * | 4/2005 | Root | 324/754 |
| 6,930,498 B2 | * | 8/2005 | Tervo et al. | 324/754 |
| 7,180,312 B2 | * | 2/2007 | Arisaka et al. | 324/754 |
| 7,262,611 B2 | * | 8/2007 | Mathieu et al. | 324/750.16 |
| 2003/0062917 A1 | * | 4/2003 | Yagi | 324/765 |
| 2003/0184330 A1 | * | 10/2003 | Arisaka et al. | 324/754 |

FOREIGN PATENT DOCUMENTS

| | | | |
|---|---|---|---|
| JP | 56-061136 A | | 5/1981 |
| JP | 03-276656 A | | 12/1991 |
| JP | 07-201935 | * | 8/1995 |
| JP | 07-201935 A | | 8/1995 |
| JP | 09-172143 A | | 6/1997 |
| JP | 10-206463 A | | 8/1998 |

OTHER PUBLICATIONS

International Search Report of PCT/JP2007/056598, Mailing Date of May 15, 2007.

* cited by examiner

*Primary Examiner* — Richard Isla Rodas
(74) *Attorney, Agent, or Firm* — Westerman, Hattori, Daniels & Adrian, LLP

(57) ABSTRACT

A testing device of a semiconductor device includes a first board having a plurality of openings; a frame body provided in the openings, the frame body having a frame in which a plurality of probe needles is provided; and a plurality of second boards provided perpendicular to the first board in the periphery of the openings, the second boards being connected to the first board; wherein the probe needles pierce the frame so as to be connected to the second boards from the periphery of the frame body via the openings.

6 Claims, 11 Drawing Sheets

TESTING DEVICE FOR TESTING A SEMICONDUCTOR DEVICE

CROSS-REFERENCE TO RELATED APPLICATIONS

This application is a U.S. continuation application filed under 35 USC 111(a) claiming benefit under 35 USC 120 and 365(c) of PCT application JP07/056598, filed on Mar. 28, 2007. The foregoing application is hereby incorporated herein by reference.

FIELD

The embodiments discussed herein are related to testing devices of semiconductor devices.

BACKGROUND

As functions and properties required for electronic devices are improved, high integration, high speed or mass storage is required for semiconductor devices (LSIs) provided in the electronic devices.

Because of this, in a semiconductor chip (LSI chip) forming the semiconductor device, operating speed is being increased; the number of outside connection terminals is being increased; and gaps between the outside connection terminals are being narrowed. Especially, in a system LSI element, this tendency is remarkable. Therefore, it may be difficult to perform a test of the system LSI element with high reliability.

In addition, time for performing the test is becoming long. Accordingly, in order to keep and improve productivity and reduce manufacturing costs, an arrangement for performing a simultaneous test of plural semiconductor elements having a large number of the outside connection terminals such as a system LSI element has been suggested.

For example, as an arrangement for performing the simultaneous test of plural semiconductor elements formed by a single semiconductor substrate, the following arrangement has been suggested. That is, probe needles provided at a probe card come in contact with electrode terminals of two semiconductor elements formed by a single semiconductor substrate, the semiconductor elements neighboring in horizontal, vertical, and oblique directions, so that tests of the two semiconductor elements are simultaneously performed. See, for example, Japanese Laid-Open Patent Application Publication No. 56-61136 and Japanese Laid-Open Patent Application Publication No. 9-172143.

In addition, for example, Japanese Laid-Open Patent Application Publication No. 7-201935 describes a probe card including plural probe units, a base configured to support the probe units, and a wiring plate configured to electrically connect the probe units and an outside tester to each other. The probe unit includes a large number of probe needles which can simultaneously come in contact with electrode terminals of plural integrated circuit chips, a wiring board extending in a direction perpendicular to a surface of the chip, and a supporting body configured to provide the probe unit to the base.

In a semiconductor substrate (wafer) where plural semiconductor elements having a large number of minute outside connection terminals are formed, when the plural semiconductor elements are tested, in order to maintain and improve productivity and reduce manufacturing costs, it is necessary to perform the test with high test precision. More specifically, it is necessary to improve efficiency (measuring efficiency and test efficiency) of measurement (test) using the test device.

SUMMARY

According to an aspect of the invention, a testing device of a semiconductor device including a first board having a plurality of openings; a frame body provided in the openings, the frame body having a frame in which a plurality of probe needles is provided; and a plurality of second boards provided perpendicular to the first board in the periphery of the openings, the second boards being connected to the first board; wherein the probe needles pierce the frame so as to be connected to the second boards from the periphery of the frame body via the openings is provided.

According to another aspect of the invention, a testing device of a semiconductor device, including a first board including a plurality of openings; a frame body provided in the openings, the frame body having a frame in which a plurality of probe needles is provided; and a plurality of second boards provided at a surface opposite to a surface where the frame body is provided at the openings, the second boards being provided in parallel with the first board so as to face the openings, the second boards being connected to the first board; wherein the probe needles pierce the frame so as to be connected to the second boards from the periphery of the frame body via the openings.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Preferred embodiments will be explained with reference to accompanying drawings. The embodiments can be applied to testing devices of semiconductor devices, more specifically, a testing device of a semiconductor device used for testing plural semiconductor elements formed on a single semiconductor substrate (wafer).

First Embodiment

Figure 1:
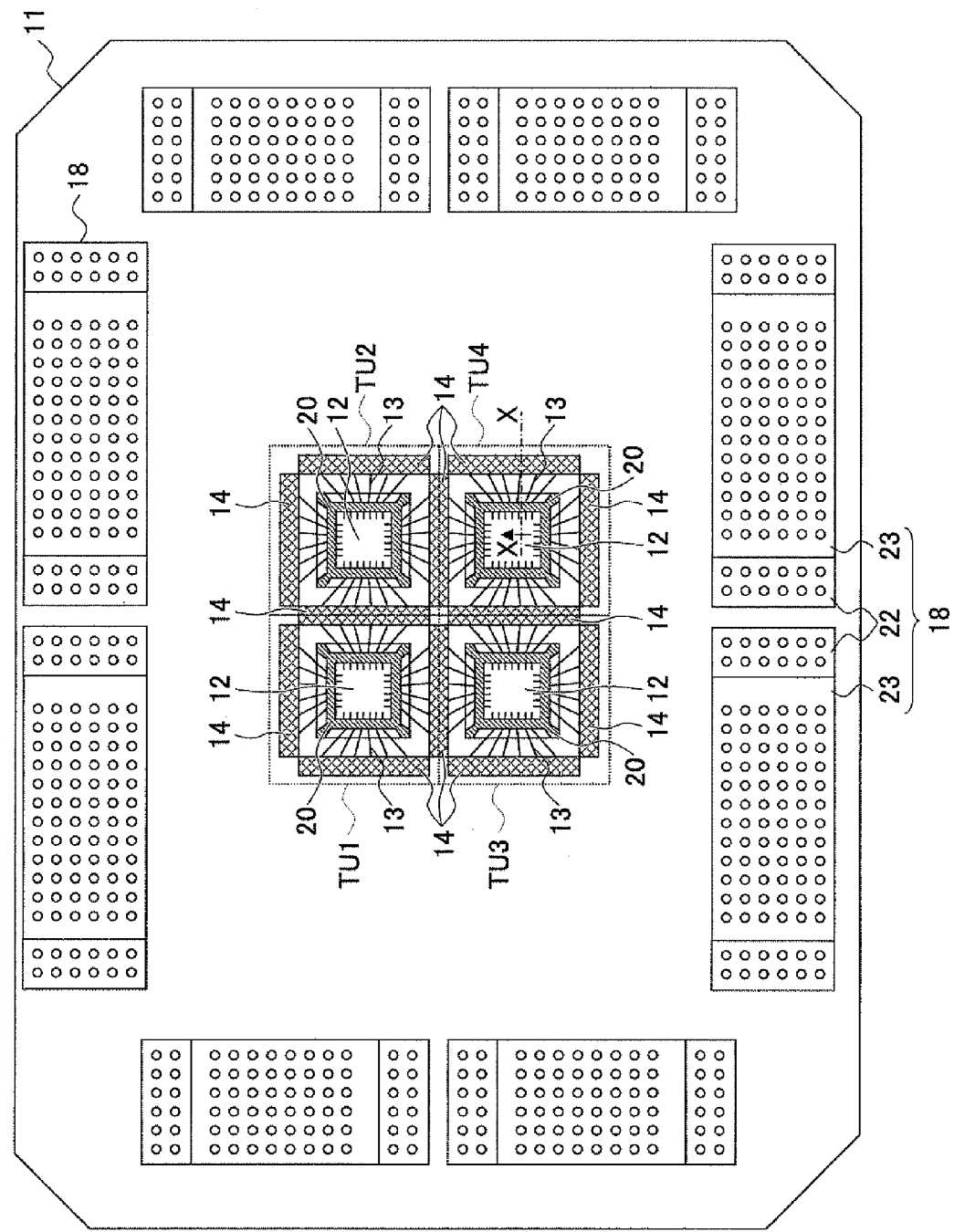
FIG. 1 is a plan view of a testing device of a semiconductor device of a first embodiment.

FIG. 1 is a plan view of a testing device of a semiconductor device of a first embodiment.

As illustrated in FIG. 1, four testing units (TU1 through TU4) are provided on a probe card board 11 of a probe card 10 used in the testing device of the semiconductor device of the first embodiment.

The probe card board (testing circuit board) 11 has a multilayer wiring structure including an interlayer insulation material and plural conductive layers. The interlayer insulation material is made of, for example, glass epoxy resin. The conductive layers are made of copper (Cu) provided on a surface and a rear surface and inside of the interlayer insulation material. The multilayer wiring structure includes electric signal lines, an electric power source conductive layer, and a ground conductive layer. The electric signal lines, electric power source conductive layer, and the ground conductive layer are provided in each of the testing units TU1 through TU4.

In each of the testing units TU1 through TU4, an opening part 12 is formed. The opening part 12 pierces the probe card board 11 and has a substantially rectangular-shaped configuration. The substantially rectangular-shaped configuration of the opening part 12 substantially corresponds to a configuration of a semiconductor element (LSI chip) to be tested. The semiconductor element is formed on a semiconductor substrate (wafer).

In the vicinity of each side of the opening part 12, a circuit board 14 where probe needles 13 are connected is fixed to the probe card board 11. The circuit board 14 is fixed to the probe card board 11 in a direction substantially in parallel with a corresponding side of the opening part 12 and in a direction substantially perpendicular to a main surface of the probe card board 11. It is not necessary for the connecting angle of the circuit board 14 with a main surface of the probe card board 11 to be 90 degrees. The circuit board 14 may be inclined at a designated angle with the main surface of the probe card board 11.

In an example illustrated in FIG. 1, twelve of the circuit boards 14 are provided on the probe card board 11.

The circuit board 14 has a multilayer wiring structure including an interlayer insulation material and plural conductive layers. The interlayer insulation material is made of, for example, glass epoxy resin. The conductive layers are made of copper (Cu) provided on a surface and a rear surface and inside of the interlayer insulation material. The multilayer wiring structure includes electric signal lines, an electric power source conductive layer, and a ground conductive layer.

Figure 2:
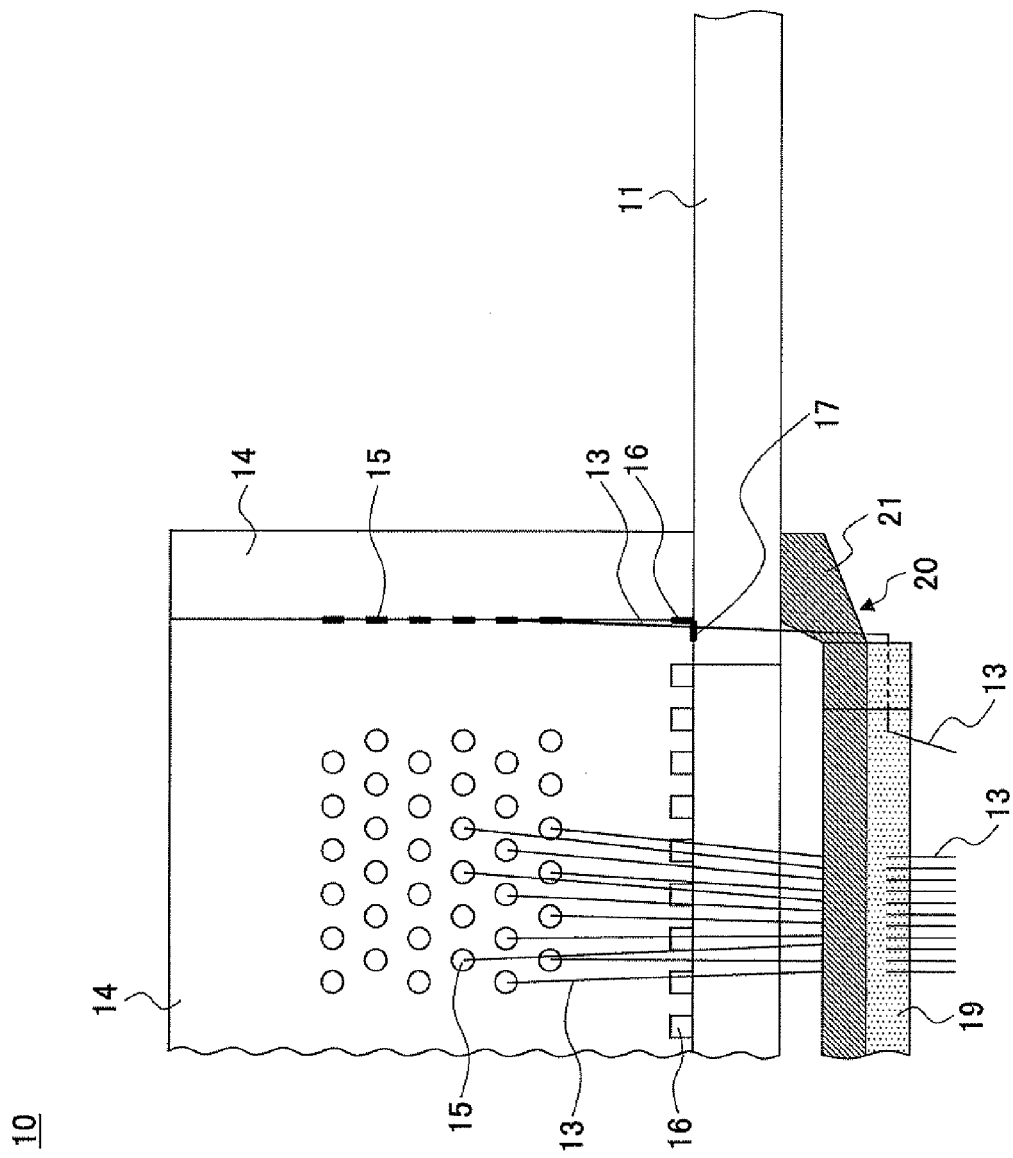
FIG. 2 is a view taken along a line X-X and seen in a direction indicated by an arrow in FIG. 1.

Here, FIG. 2 is also referred to. FIG. 2 is a view taken along a line X-X and seen in a direction indicated by an arrow in FIG. 1.

As illustrated in FIG. 2, plural electrode terminals 15 are provided on a main surface of the circuit board 14. The probe needles 13 are connected to the electrode terminals 15. The number of the probe needles 13 and gaps between neighboring of the probe needles 13 are set corresponding to the arrangement of the electrode terminals of the to be tested semiconductor element. The probe needle 13 is made of, for example, tungsten (W).

Electrode terminals 16 are formed at an edge part of a surface of the circuit board 14 coming in contact with the probe card board 11. In addition, electrode terminals 17 are formed at a portion of the main surface of the probe card board 11 coming in contact with the corresponding electrode terminals 16. The electrode terminals 16 of the circuit board 14 and the electrode terminals 17 of the probe card board 11 can be formed minutely and with high precision by using a photolithography technique and an etching technique. The electrode terminals 16 of the circuit board 14 and the corresponding electrode terminals 17 of the probe card board 11 come in direct contact with each other and are fixed via a conductive member such as solder.

The electrode terminals 15 where the probe needles 13 are connected are connected to the corresponding electrode terminals 16 via wirings formed in an inside later or a surface layer. The electrode terminals 16 are connected to the electrode terminals 17 of the probe card board 11 and electrically connected to a pin connecting terminal part 18 (see FIG. 1) via wiring in a surface layer or an inside layer of the probe card board 11.

The electrode terminals 15 are formed on both main surfaces (a surface and a rear surface) of the circuit boards 14 provided between the testing unit TU1 and the testing unit TU2, between the testing unit TU1 and the testing unit TU3, between the testing unit TU3 and the testing unit TU4, and between the testing unit TU2 and the testing unit TU4. The probe needles 13 of the testing units TU1 through TU4 are connected to the corresponding electrode terminals 15 at the main surfaces of the circuit boards 14.

The embodiment is not limited to the above-mentioned example. Two circuit boards 14 whose rear surfaces are in contact with each other may be provided between the testing unit TU1 and the testing unit TU2, between the testing unit TU1 and the testing unit TU3, between the testing unit TU3 and the testing unit TU4, and between the testing unit TU2 and the testing unit TU4.

In the meantime, the probe needles 13 connected to the electrode terminals 15 formed on the main surfaces of the circuit boards 14 are fixed so that the probe needles 13 pierce a resin part 19 made of epoxy resin or resin having adhesion and head ends of the probe needles 13 come in contact with outside connection electrode terminals of the to be tested semiconductor element (LSI chip).

Figure 3:
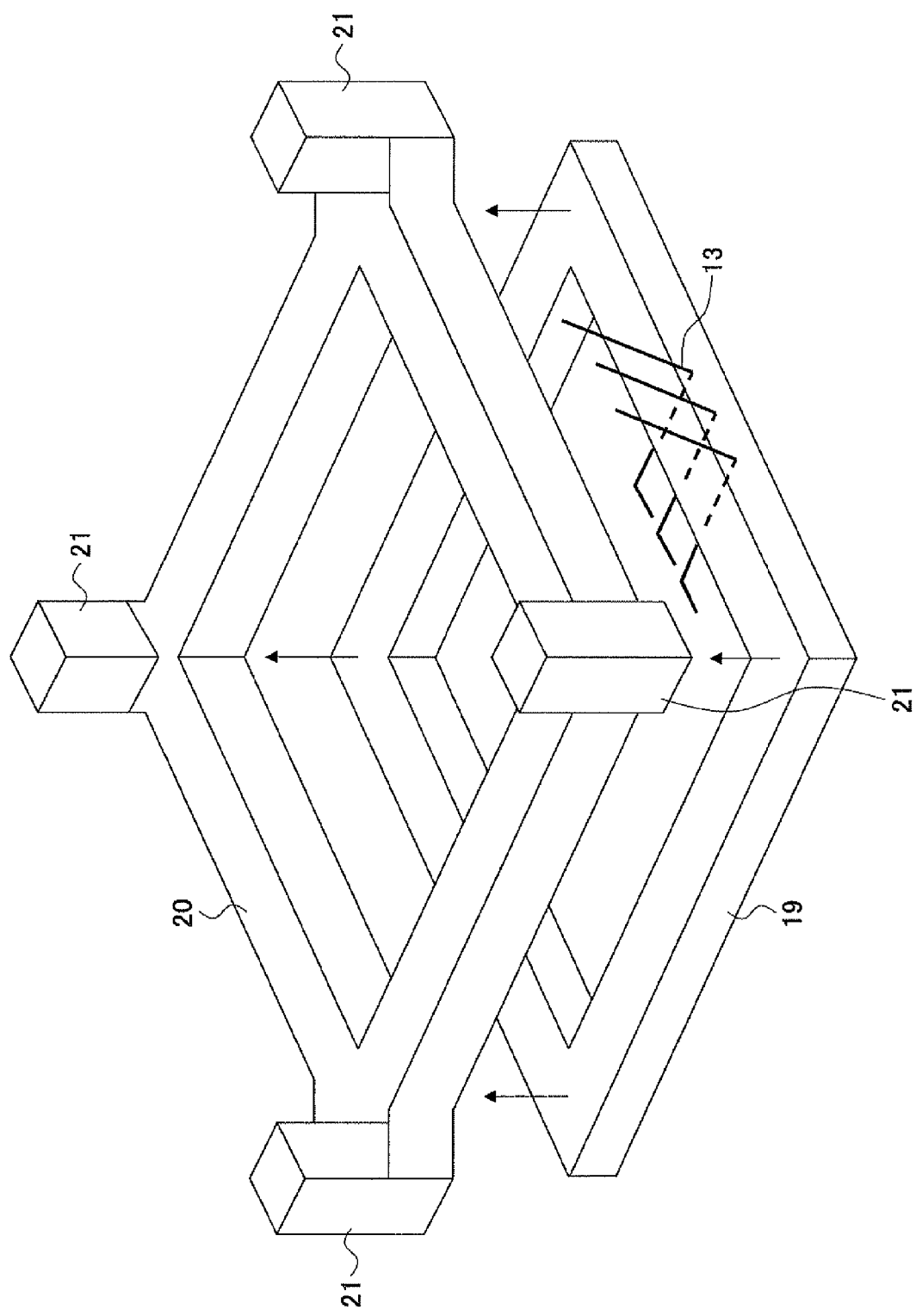
FIG. 3 is an exploded and perspective view of a resin part illustrated in FIG. 2 and a frame body part where the resin part is adhered and fixed.

Here, FIG. 3 in addition to FIG. 2 is referred to. FIG. 3 is an exploded perspective view of the resin part 19 illustrated in FIG. 2 and a frame body part 20 where the resin part 19 is adhered and fixed.

The frame body part (resin part fixing part) 20 made of, for example, ceramic or the like has a hollow structure. The frame body part 20 is connected and fixed to the probe card board 11 via corner parts 21. More specifically, The frame body part 20 is connected and fixed to the probe card board 11 so that a hollow part of the frame body part 20 is positioned in the opening part 12 of the probe card board 11.

On the other hand, the resin part 19 also has a hollow structure. The resin part 19 is connected and fixed to the main surface of the frame body part 20 in a direction indicated by arrows in FIG. 3.

Accordingly, the probe needles 13 piercing the resin part 19 are fixed to the probe card board 11 via the frame body part 20.

Thus, the probe needles 13 are fixed on the frame body part 20 provided at the opening part 12 of the probe card board 11 via the resin part 19. Ends of the probe needles 13 are connected to the electrode terminals 15 of the circuit board 14 electrically connected to the probe card board 11. Other ends of the probe needles 13 come in contact with the electrode terminals of the to be tested semiconductor element (LSI chip).

Thus, referring back to FIG. 1, the pin connecting terminal parts 18 are provided in the vicinity of the external circumference of the main surface of the probe card board 11 along the external circumference of the probe card board 11.

At the time of testing the tested semiconductor element (LSI chip), testing terminals (not illustrated) extending from an LSI tester main body which is a main testing device are connected to the pin connecting terminal parts 18, so that supply of the electric power, application of testing signals, and others are performed. Because of this, the pin connecting terminal parts 18 are provided in the vicinity of the external circumference of the probe card board 11.

The pin connecting terminal parts 18, corresponding to electrodes and terminals of the LSI tester main body, are each divided into an electric power source supply terminal part 22 and a testing signal terminal part 23. Each of the electric power source supply terminal part 22 and the testing signal terminal part 23 includes plural terminals.

Thus, in the examples illustrated in FIG. 1 through FIG. 3, in the vicinity of each side of the opening parts 12 formed in the probe card board 11, one of the circuit boards 14 where the probe needles 13 are connected is fixed substantially perpendicular to the main surface of the probe card board 11. Accordingly, the area of a region where the probe needles 13 are connected is a small occupying region of the circuit board 14. Therefore, it is possible to efficiently provide plural of the testing units TU1 through TU4 which are units for measuring or testing a single semiconductor element on a single probe card board 11 without large separation.

Figure 4:
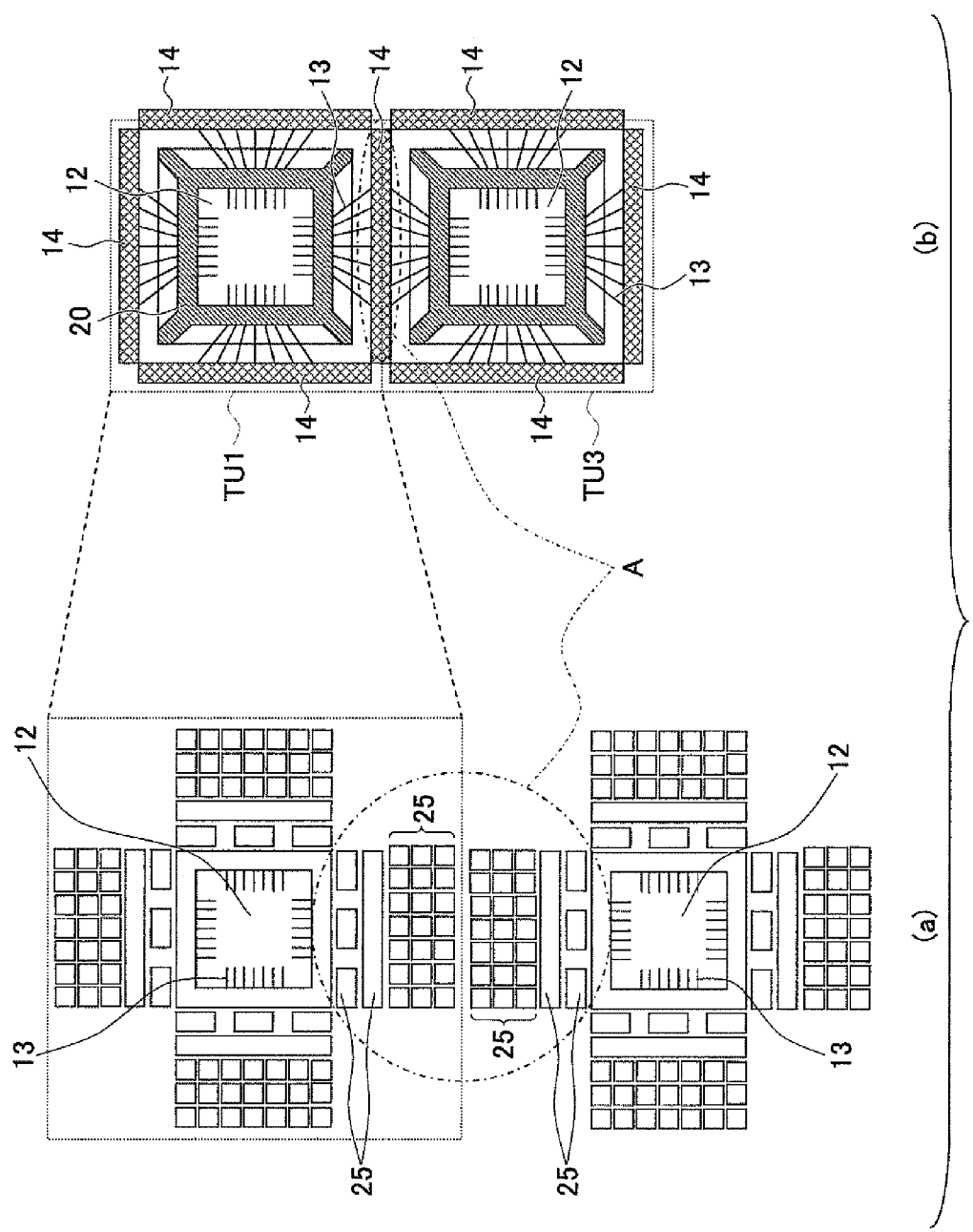
FIG. 4 is a view for explaining an effect of the testing device of the semiconductor device.

This structure is further discussed with reference to FIG. 4. FIG. 4(a) is a partial plan view of a comparison example. FIG. 4(b) is a partial plan view of a portion of the probe card board 11 of the testing device of the semiconductor device of the first embodiment, the portion being where the testing unit TU1 and the testing unit TU3 are provided. In FIG. 4(a), parts that are the same as the parts illustrated in FIG. 2 are given the same reference numerals, and explanation thereof is omitted.

In the examples illustrated in FIG. 1 through FIG. 3, the probe needles 13 whose head ends come in contact with the electrode terminals of the tested semiconductor device (LSI chip) are connected to the circuit board 11 substantially perpendicularly fixed to and electrically connected to the probe card board 11.

On the other hand, an example where the circuit board 14 is not used for connecting the probe needles 13 to the circuit board 14 is the comparison example illustrated in FIG. 4(a).

In the example illustrated in FIG. 4(a), the electrode terminals 25 where the probe needles 13 are connected are provided in the vicinity of the opening part 12 of the probe card board 11, namely in an area indicated by a one dotted line in FIG. 4(a). Accordingly, in the example illustrated in FIG. 4(a), a portion corresponding to the gap (indicated by one dotted line A in FIG. 4(b)) between the testing unit TU1 and the testing unit TU3 of the testing device of the first semiconductor device of the first embodiment is large.

In other words, in the example illustrated in FIG. 4(a), the probe needles 13 and the electrode terminals 25 of the probe card board are provided between the neighboring testing units. Therefore, it is necessary to provide the testing unit in a position separated in length corresponding to plural tested semiconductor elements (LSI chips).

Because of this, in the example illustrated in FIG. 4(a), in measuring (testing) in the vicinity of the semiconductor substrate (wafer) where the tested semiconductor elements (LSI chips) are formed, some of the testing units may be outside of the semiconductor substrate (wafer) area or the area of the semiconductor substrate (wafer) where the tested semiconductor elements (LSI chips) are formed. As a result of this, a testing unit which does not contribute to the measuring (testing) may be provided so that the measuring efficiency (testing efficiency) may be degraded.

In order to solve such a problem, for example, the electrode terminals 25 of the probe card board 11 may be miniaturized. However, in this case, it is necessary to connect the probe needles 13, one by one, to the electrode terminals 25 by a manual or equivalent way. Accordingly, if the electrode terminals 25 are miniaturized, it is difficult to connect the probe needles 13 and the electrode terminals 25.

On the other hand, in the testing device of the semiconductor device of the first embodiment, as illustrated in FIG. 2, the electrode terminals 15 where the probe needles 13 are connected are provided on the surface of the circuit board 14. Furthermore, the circuit board 14 is provided substantially perpendicular to the main surface of the probe card board 11. Therefore, it is possible to make the area indicated by the one dotted line A in FIG. 4(b), namely, the gap between the testing unit TU1 and the testing unit TU3, narrow.

In the testing device of the semiconductor device of the first embodiment, the electrode terminals 15 are formed on both main surfaces (a surface and a rear surface) of each of the circuit boards 14 provided between the testing unit TU1 and the testing unit TU2, between the testing unit TU1 and the testing unit TU3, between the testing unit TU3 and the testing unit TU4, and between the testing unit TU2 and the testing unit TU4.

Accordingly, the probe needles 13 connected to the electrode terminals 15 provided on the surface of the probe card board 11 and the probe needles 13 connected to the electrode terminals 15 provided on the rear surface of the probe card board 11 can correspond to different tested semiconductor elements (LSI chips). Because of this, it is possible to provide the plural testing units by making the gap between the neighboring testing units small.

Furthermore, in the testing device of the semiconductor device of the first embodiment, the electrode terminals 17 formed in the area indicated by the one dotted line A in FIG. 4(b) are used for connecting to the electrode terminals 16 of the circuit boards 14. The probe needles 13 are not connected to the electrode terminals 17 formed in the area indicated by the one dotted line A in FIG. 4(b). Accordingly, even if the electrode terminals 17 are miniaturized, the above-discussed problems in FIG. 4(a) which may be caused by the connection of the probe needles 13 can be avoided.

In addition, as discussed above, the electrode terminals 16 of the circuit board 14 and the electrode terminals 17 of the probe card board 11 are formed minutely and with high precision by using, for example, a photolithography technique and an etching technique so as to be connected to and adhered to each other via an adhesive member such as solder or the like. Accordingly, connection between the probe card board 11 and the circuit boards 14 are realized with a simple structure.

A connector may be provided between the electrode terminals 16 of the circuit boards 14 and the electrode terminals 17 of the probe card board 11 so that the electrode terminals 16 of the circuit boards 14 and the electrode terminals 17 of the probe card board 11 may be electrically connected to each other via the connector. With this arrangement, it is possible to easily turn off the connection between the electrode terminals 16 of the circuit boards 14 and the electrode terminals 17 of the probe card board 11, if necessary.

Thus, in the example illustrated in FIG. 1 through FIG. 3, in the vicinity of each side of the opening parts 12 formed in the probe card board 11, one of the circuit boards 14 where the probe needles 13 are connected is fixed substantially perpendicularly on the main surface of the probe card board 11. Accordingly, the area of a region where the probe needles 13 are connected is a small occupying region of the circuit board 14. Therefore, it is possible to efficiently provide plural of the testing units TU1 through TU4 which are units for measuring or testing a single semiconductor element on a single probe card board 11 without large separation.

With this structure, it is possible to improve the freedom degree of arrangement of the testing units configured to simultaneously measure (test) plural semiconductor elements. Therefore, it is possible to realize efficient simultaneous measuring (simultaneous testing). Hence, it is possible to improve productivity in producing the semiconductor elements and reduce the manufacturing cost.

In the example illustrated in FIG. 1, in the vicinity of each side of the opening part 12, one of the circuit boards 14 where probe needles 13 are connected is fixed to the probe card board 11. The circuit board 14 is fixed to the probe card board 11 in a direction substantially in parallel with a corresponding side of the opening part 12 and in a direction substantially perpendicular to a main surface of the probe card board 11. In other words, in the example illustrated in FIG. 1, twelve of the circuit boards 14 are provided on the probe card board 11.

Figure 5:
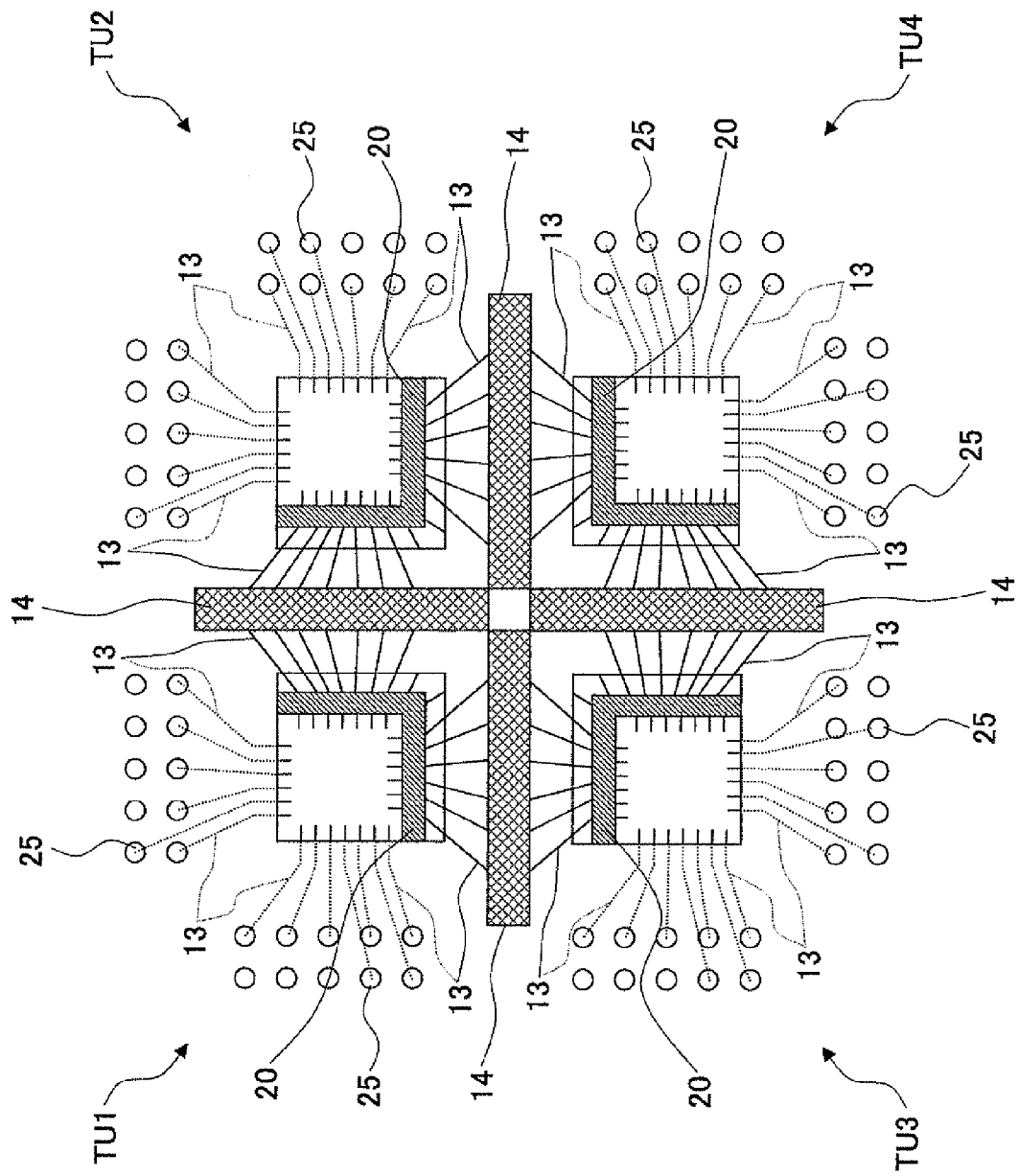
FIG. 5 is a plan view of a first modified example of the testing device of the semiconductor device of the first embodiment.
Figure 6:
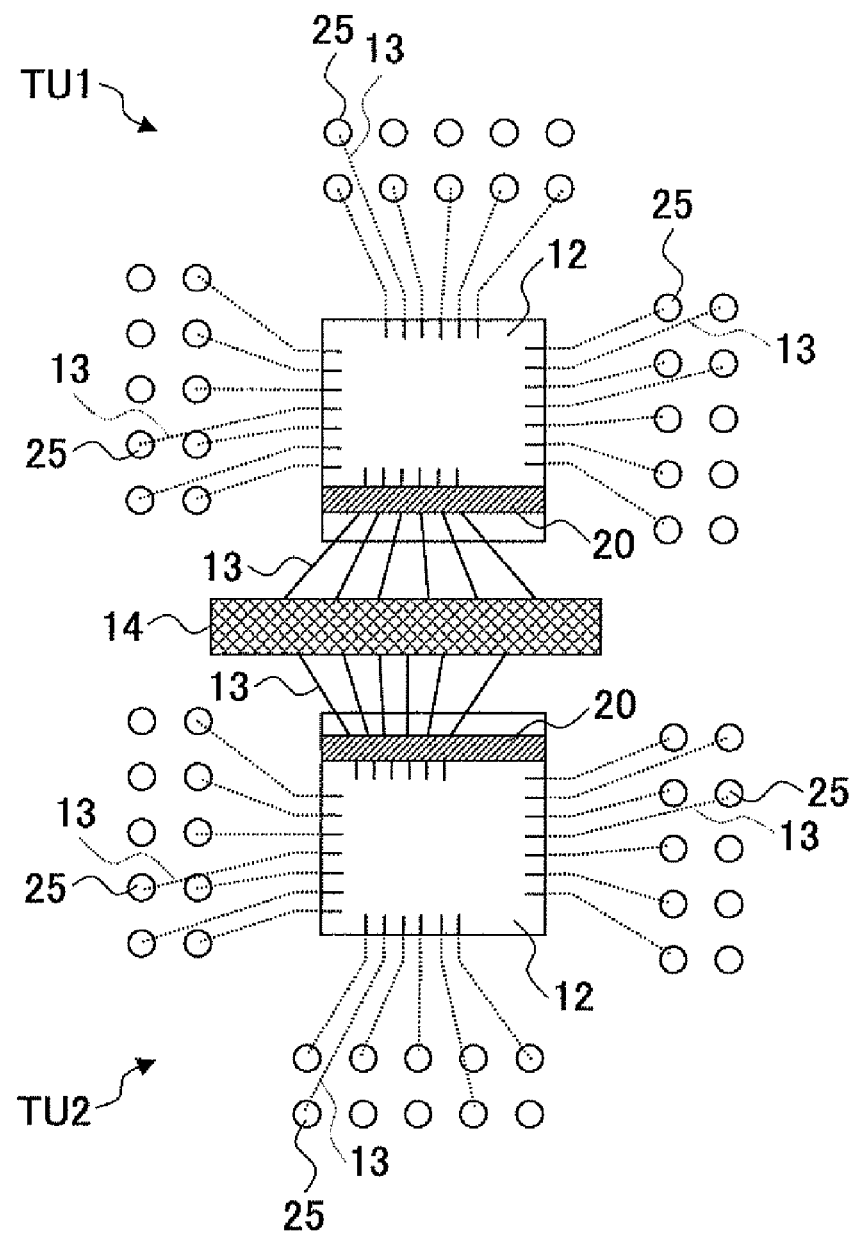
FIG. 6 is a plan view of a second modified example of the testing device of the semiconductor device of the first embodiment.
Figure 7:
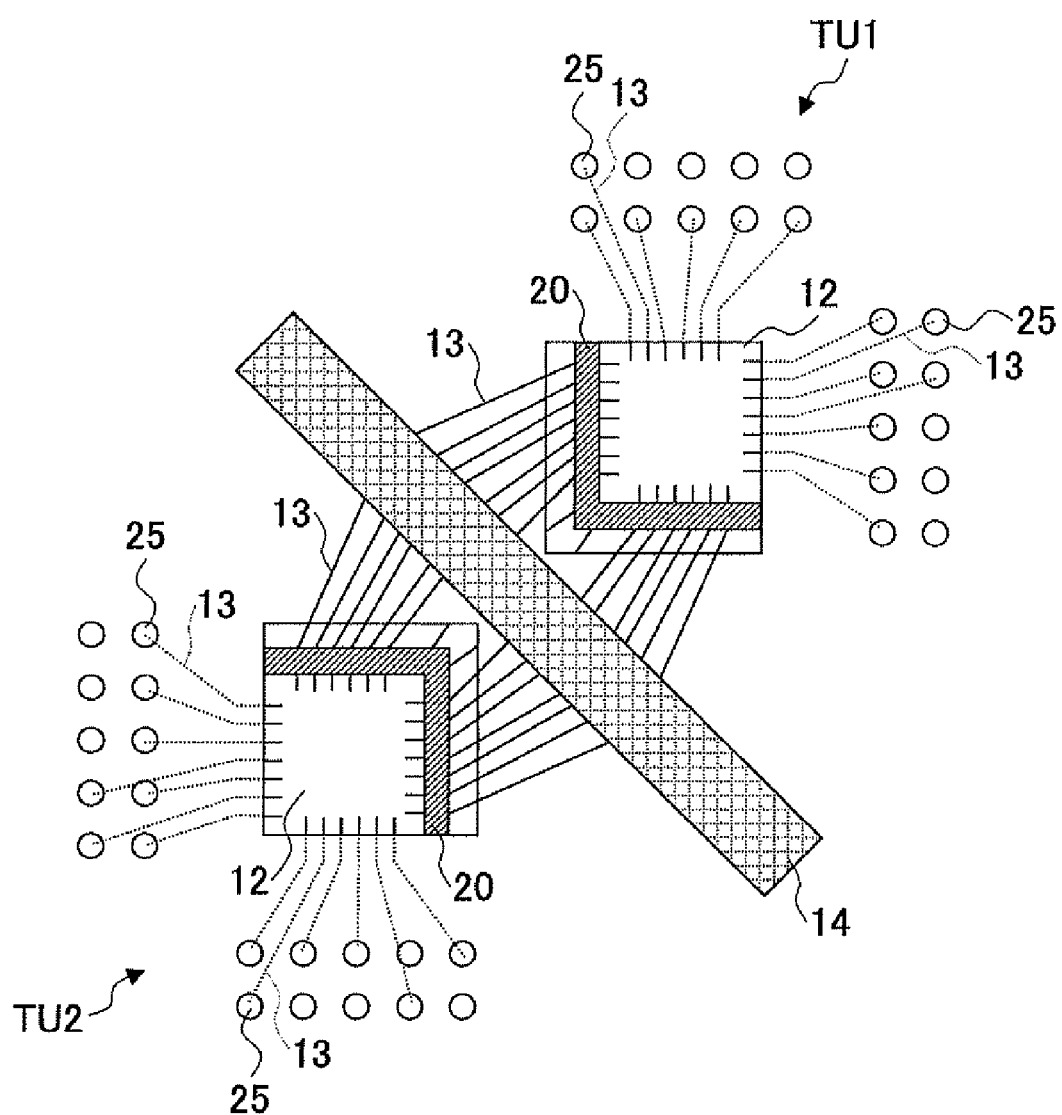
FIG. 7 is a plan view of a third modified example of the testing device of the semiconductor device of the first embodiment.

However, the embodiment is not limited to the above-discussed example. As illustrated in FIG. 5 through FIG. 7, the circuit boards 14 where the probe needles 13 are connected may be provided in neighboring positions of external circumferential sides of the opening parts 12 of the probe card board 11 having substantially rectangular-shaped configurations.

Here, FIG. 5 through FIG. 7 are plan views showing first through third modified examples of the testing device of the semiconductor device of the first embodiment. Only the opening parts 12 of the probe card board 11 and vicinities thereof are illustrated in FIG. 5 through FIG. 7. Other parts of the probe card 11 in the examples illustrated in FIG. 5 through FIG. 7 are the same as parts illustrated in FIG. 1 and illustration thereof is omitted. Furthermore, in FIG. 5 through FIG. 7, parts that are the same as the parts illustrated in FIG. 1 are given the same reference numerals, and explanation thereof is omitted.

In the example illustrated in FIG. 5, the circuit boards 14 where the probe needles 13 are connected are provided in the vicinity of the external circumferential sides of the opening parts 12 of the probe card board 11 having the substantially rectangular shaped configuration, only between the neighboring testing unit TU1 and testing unit TU2, between the neighboring testing unit TU1 and testing unit TU3, between the neighboring testing unit TU3 and testing unit TU4, and between the neighboring testing unit TU2 and testing unit TU4. In the vicinity of other sides of the external circumference of the opening parts 12, the probe needles 13 are connected to the electrode terminals 25 formed on the probe card board 11.

In this arrangement, the circuit boards 14 where the probe needles 13 are connected are provided among the neighboring testing units TU1 through TU4. Accordingly, there is no need to arrange the testing units TU1 through TU4 with large separation. Hence, it is possible to efficiently provide plural testing units Tu1 through TU4 on a single probe card board 11.

In the example illustrated in FIG. 6, two opening parts 12 having substantially rectangular-shaped configurations are formed in the probe card board 11. The circuit board 14 where the probe needles 13 are connected is provided in the vicinity of the external circumferential sides of the opening parts 12 between the neighboring testing unit TU1 and the testing unit TU2 in a vertical direction in FIG. 6. In the vicinities of other sides of the external circumference of the opening parts 12, without using the circuit board 14, the probe needles 13 are connected to the electrode terminals 25 formed on the probe card board 11.

In this example, the circuit board 14 where the probe needles 13 are connected is provided between the neighboring testing units TU1 and TU2. Therefore, there is no need to provide the testing units TU1 and TU2 with large separation. Hence, it is possible to efficiently provide the testing units TU1 and TU2 on a single probe card board 11.

In the example illustrated in FIG. 7, two opening parts 12 having substantially rectangular-shaped configurations of the probe card board 11 are formed in an oblique relative direction. Only at neighboring two side of the external circumference of the opening parts 12, namely only between the testing units TU1 and TU2 neighboring in the oblique direction, the circuit board 14, where the probe needles 13 are connected, is provided. In the vicinity of other sides of the external circumference of the opening parts 12, the probe needles 13 are connected to the electrode terminals 25 formed on the probe card board 11 without using the circuit board 14.

In this example, the circuit board 14 where the probe needles 13 are connected is provided between the testing units TU1 and TU2 neighboring in the oblique direction. Therefore, there is no need to provide the testing units TU1 and TU2 with large separation. Hence, it is possible to efficiently provide the testing units TU1 and TU2 on a single probe card board 11.

In the meantime, an electronic component or other electrode terminals may be, if necessary, connected to the electrode terminals 15 where the probe needles 13 are not connected among plural electrode terminals 15 formed on the main surface of the circuit board 14 provided substantially perpendicularly on the probe card board 11. This is discussed with reference to FIG. 8.

Figure 8:
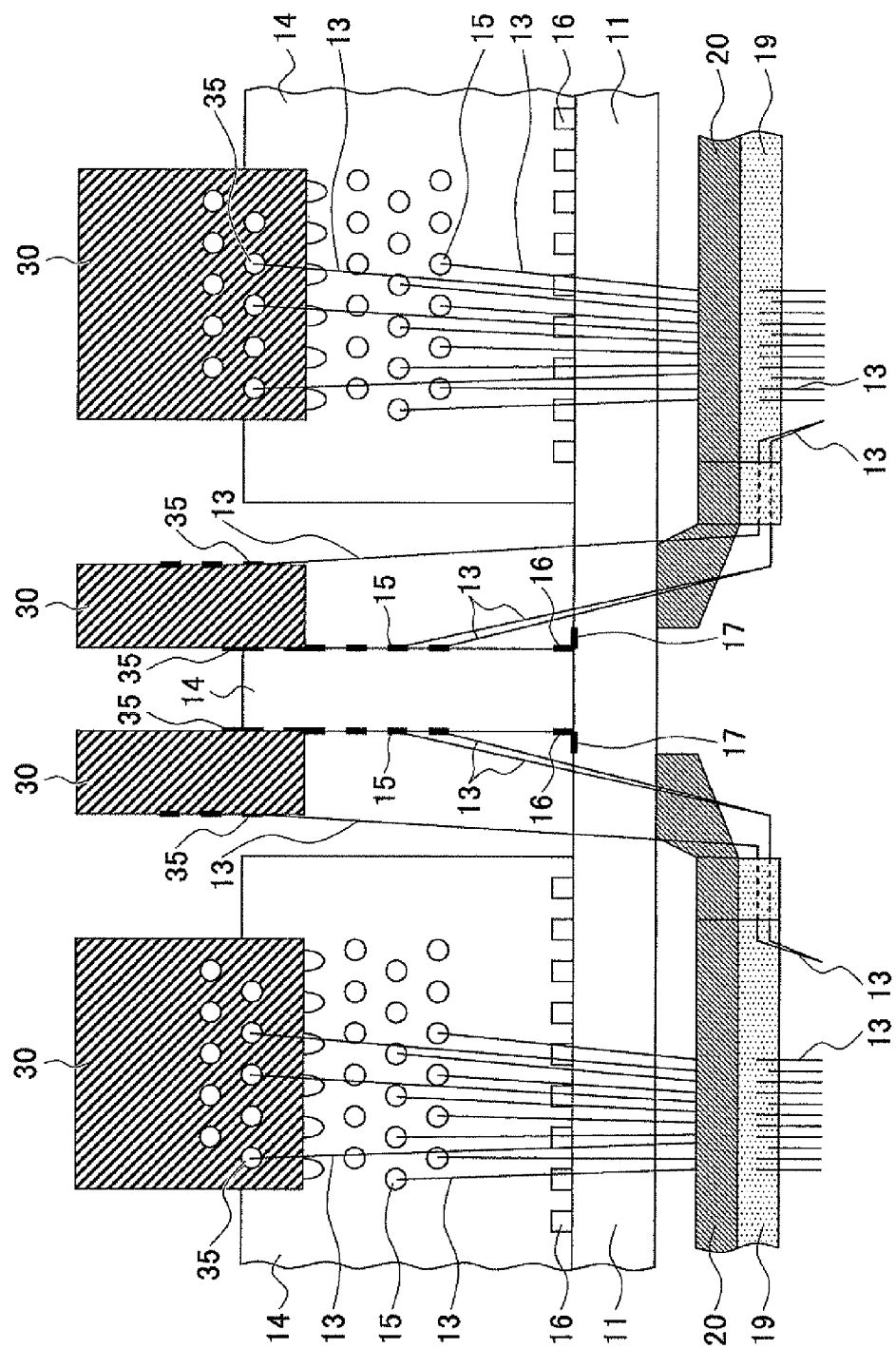
FIG. 8 is a plan view of a fourth modified example of the testing device of the semiconductor device of the first embodiment.

FIG. 8 is a plan view of a fourth modified example of the testing device of the semiconductor device of the first embodiment. FIG. 8 is a view of the semiconductor device taken at the opening parts 12 of the probe card board 11. In FIG. 8, parts that are the same as the parts illustrated in FIG. 2 are given the same reference numerals, and explanation thereof is omitted.

In the example illustrated in FIG. 8, wiring boards 30 are provided on the main surfaces of the corresponding circuit boards 14 provided substantially perpendicularly on the probe card board 11 so that the main surfaces of the wiring boards 30 are partially overlapped. In other words, the circuit boards 14 and the circuit boards 30 are provided in a step manner in a direction substantially perpendicular to the probe card board 11.

The circuit board 30, as well as the circuit board 14, has a multilayer wiring structure including an interlayer insulation material and plural conductive layers. The interlayer insulation material is made of, for example, glass epoxy resin. The conductive layers are made of copper (Cu) provided on a surface and a rear surface and inside of the interlayer insulation material. The multilayer wiring structure includes electric signal lines, an electric power source conductive layer, and a ground conductive layer.

Plural electrode terminals 35 are formed on main surfaces (a surface and a rear surface) of the circuit boards 30.

The probe needles 13 are connected to a part of the electrode terminals 35. The probe needles 13 connected to the electrode terminals 35 of the circuit boards 30, as well as the probe needles 13 connected to the electrode terminals 15 of the circuit boards 14, pierce the resin part 19 and are fixed to the probe card board 11 via the frame body part 20.

In the circuit board 30, the electrode terminals 35, formed on a surface opposite to a surface where the electrode terminals 35 connected to the probe needles 13 are formed, are connected to the electrode terminals 15 formed on the circuit board 14 and not connected to the probe needles 13. In other words, the circuit board 30 is connected to the circuit board 14. The probe needles 13 connected to the circuit board 30 are electrically connected to the probe card board 11 via the circuit board 14.

Thus, in the example illustrated in FIG. 8, a single circuit board 14 and two of the circuit boards 30 are provided between neighboring opening parts 12. In this example, compared to the example illustrated in FIG. 4(a), it is possible to make a space between neighboring opening parts 12 large. Therefore, there is no need to provide plural testing units with large separation.
Hence, it is possible to efficiently provide plural testing units on a single probe card board 11.

It may be necessary to use a circuit board having a different circuit structure depending on the tested semiconductor element (LSI chip) which is a measurement subject (test subject). In this case, by properly selecting the circuit board 30, it is possible to perform measuring (testing) precisely for every tested semiconductor element (LSI chip).

Second Embodiment

In the above-discussed first embodiment, the circuit board 14 where the probe needles 13 are connected is provided between the neighboring opening parts 12 substantially perpendicularly on the main surface of the probe card board 11. However, the present invention is not limited to this example. A circuit board where the probe needles 13 are connected may be provided on the probe card board 11 substantially in parallel with the main surface of the probe card board 11. This structure is discussed as the second embodiment with reference to FIG. 9 and FIG. 10.

Figure 9:
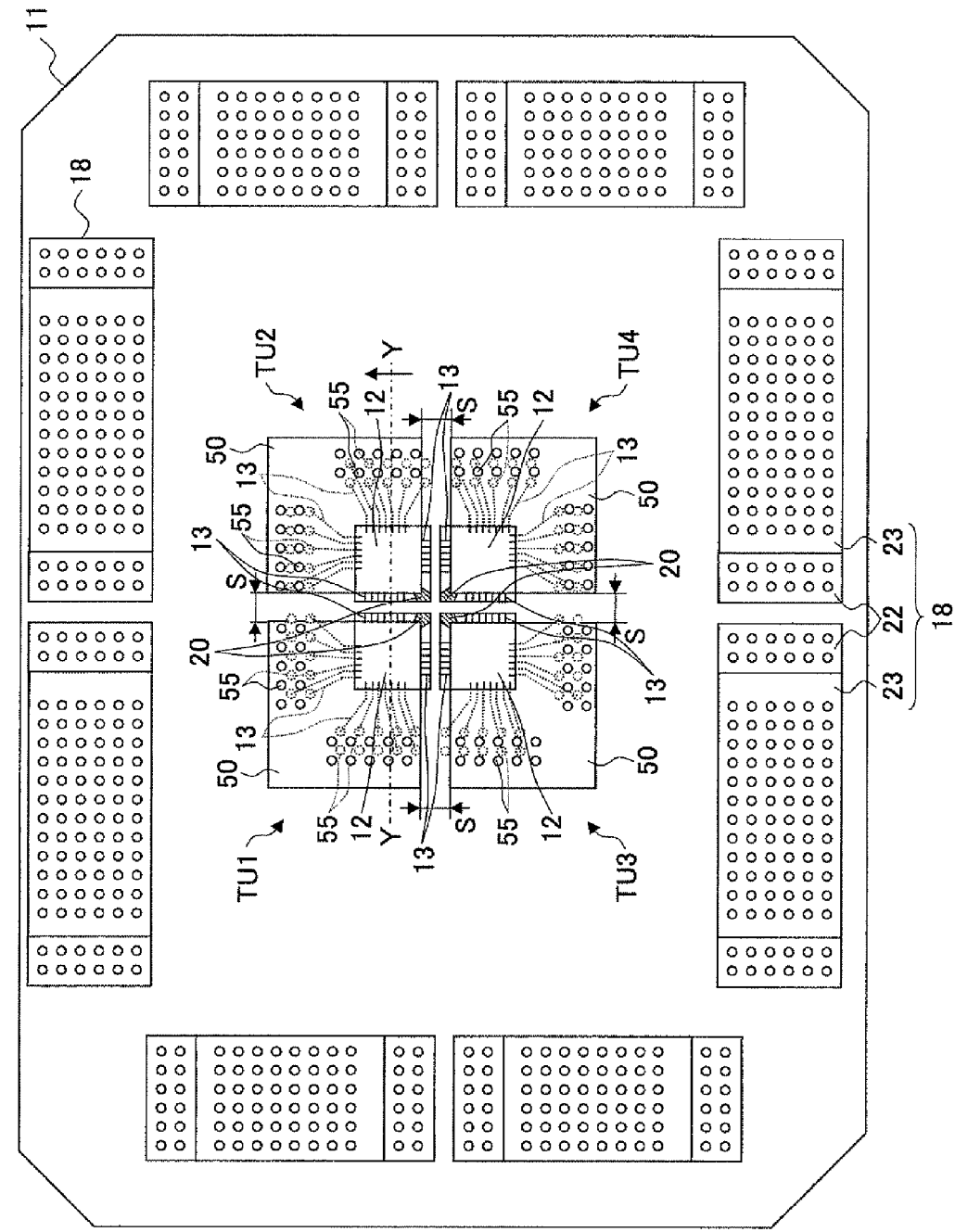
FIG. 9 is a plan view of a testing device of a semiconductor device of a second embodiment.
Figure 10:
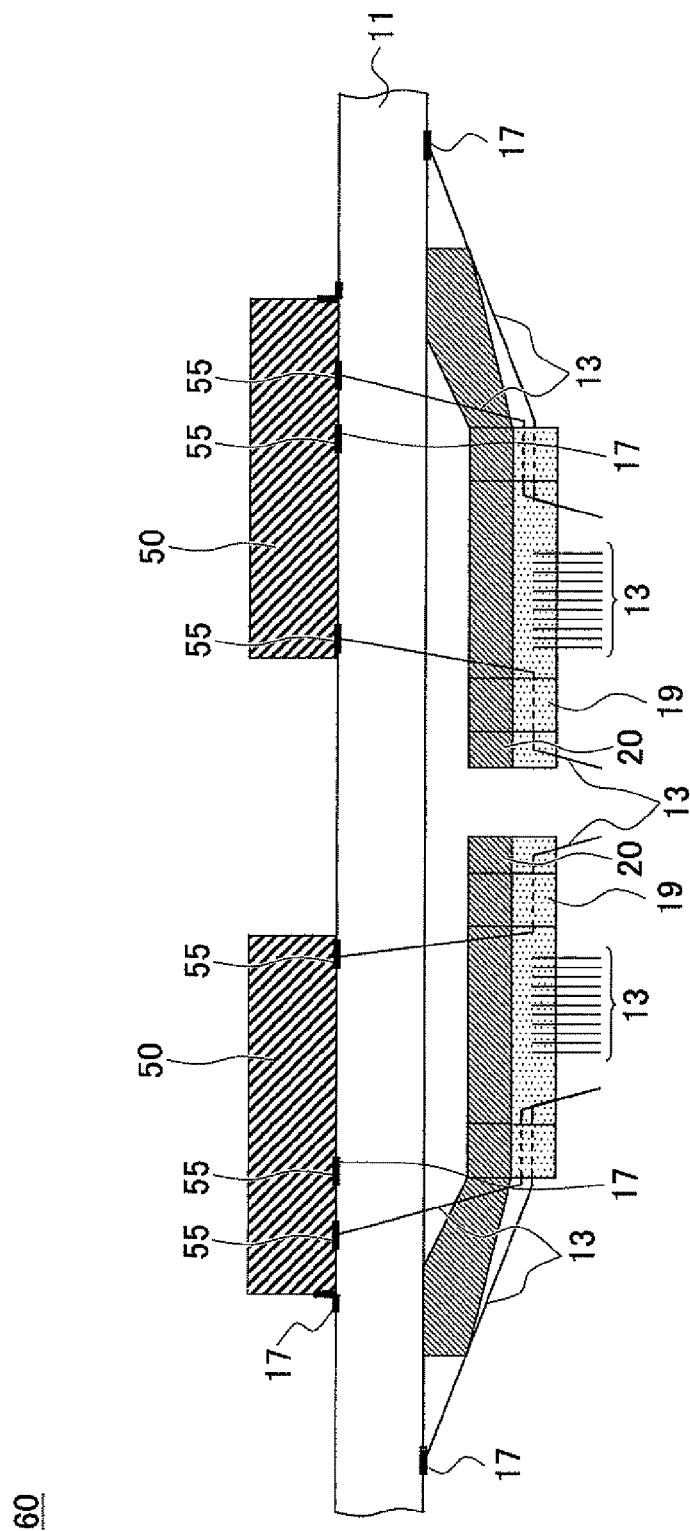
FIG. 10 is a view taken along a line Y-Y and seen in a direction indicated by an arrow in FIG. 9.

FIG. 9 is a plan view of a testing device of a semiconductor device of the second embodiment. FIG. 10 is a view taken along a line Y-Y and seen in a direction indicated by an arrow in FIG. 9. In FIG. 9 and FIG. 10, parts that are the same as the parts illustrated in FIG. 1 and FIG. 2 are given the same reference numerals, and explanation thereof is omitted.

In the probe card 60 of the testing device of the semiconductor device of the second embodiment, the circuit boards 50 where the probe needles 13 are connected are provided on the probe card board 11 for every opening part 12 so as to be arranged substantially in parallel with the main surface of the probe card board 11. The circuit board 50 substantially covers the opening part 12 formed by piercing the probe card board 11 and having the substantially rectangular-shaped configuration.

The circuit board 50, as well as the circuit board 14, has a multilayer wiring structure including an interlayer insulation material and plural conductive layers. The interlayer insulation material is made of, for example, glass epoxy resin. The conductive layers are made of copper (Cu) provided on a surface and a rear surface and inside of the interlayer insulation material. The multilayer wiring structure includes electric signal lines, an electric power source conductive layer, and a ground conductive layer.

Plural electrode terminals 55 are formed on the main surface of the circuit board 50. The above-discussed probe needles 13 are connected to a designated number of the electrode terminals 55. The electrode terminals 55 formed on a surface coming in contact with the probe card board 11 are connected to the electrode terminals 17 of the probe card board 11.

Accordingly, the circuit board 50 where the probe needles 13 are connected is electrically connected to the electrode terminals 17 of the probe card board 11 so as to be electrically connected to pin connecting terminal parts 18 via wirings formed in a surface layer or an inside layer of the probe card board 11.

In this example, the probe needles 13 are connected to the electrode terminals 17 formed on the rear surface of the probe card board 11.

In this example, as well as the first embodiment, the probe needles 13 pierce the resin part 19 made of epoxy resin or the like having adhesion so that head ends of the probe needles 13 are situated in positions coming in contact with the outside connection electrode terminals of the to be tested semiconductor element (LSI chip).

In the above-discussed first embodiment, the circuit board 14 where the probe needles 13 are connected is provided between the neighboring opening parts 12 substantially perpendicularly on the main surface of the probe card board 11. On the other hand, in the second embodiment, a circuit board 50 where the probe needles 13 are connected is provided on the probe card board 11 substantially in parallel with the main surface of the probe card board 11 without providing the circuit board 14 between the neighboring opening parts 12.

Therefore, there is no need to secure the space for providing the circuit board 14 between the neighboring opening parts 12. Hence, in this example, compared to the example illustrated in FIG. 1 and FIG. 2, it is possible to further make the space between the neighboring opening parts 12 narrow. Therefore, there is no need to provide plural testing units with large separation.
Hence, it is possible to efficiently provide plural testing units on a single probe card board 11.

In this example, spaces S (see FIG. 9) are formed between neighboring circuit boards 50. There is no need to form the spaces S. For example, side parts of the neighboring circuit boards 50 may come in contact with each other. A circuit board having a main surface whose area is substantially equal to a sum of areas of the main surfaces of four circuit boards 50 may be provided on the probe card board 11.

Figure 11:
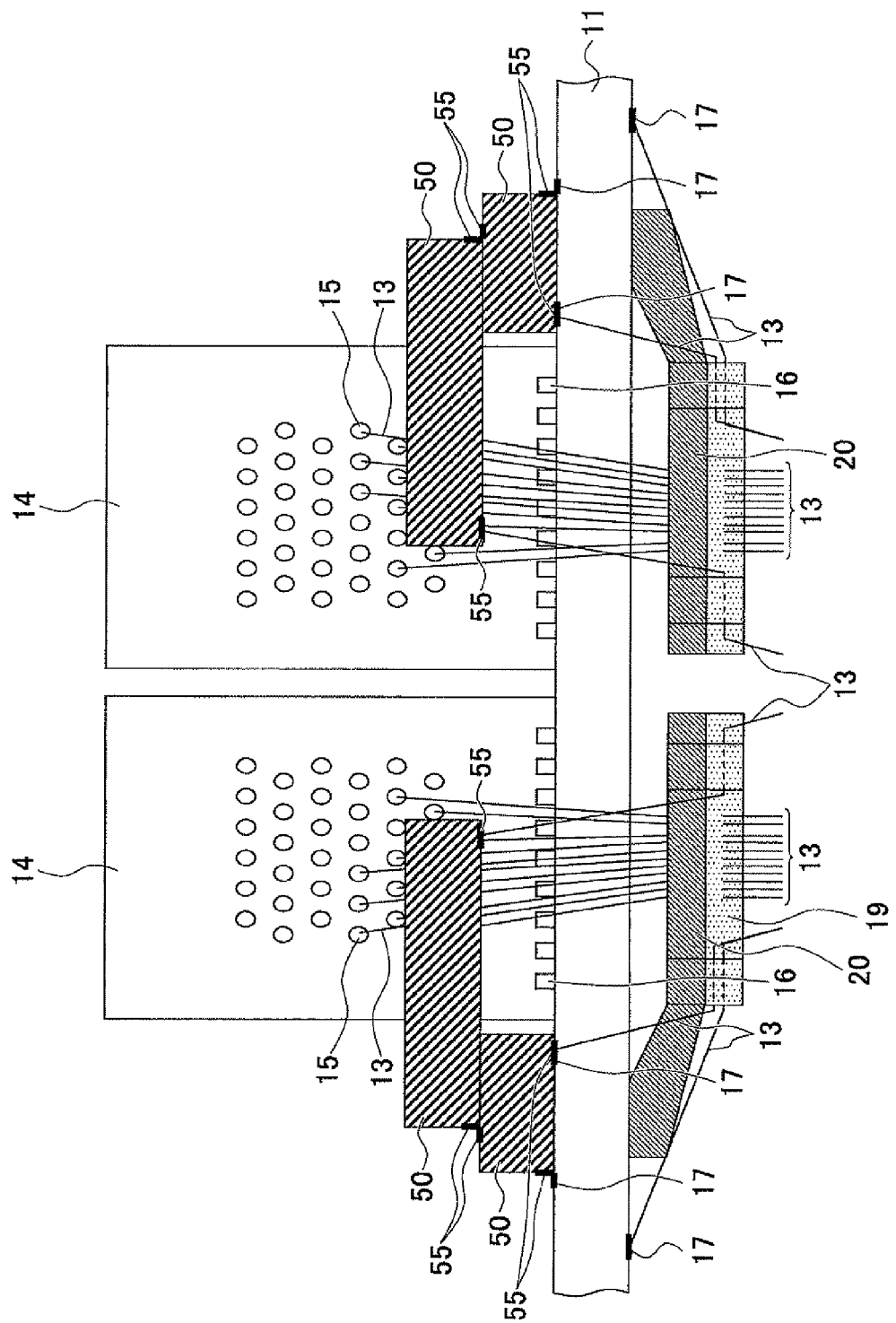
FIG. 11 is a view showing a modified example of the testing device of the semiconductor device of the first embodiment.

In the meantime, the circuit boards 50 provided on the probe card board 11 substantially in parallel with the main surface of the probe card board 11 may be stacked in a step manner. This structure is discussed as a modified example of the testing device of the semiconductor device of the second embodiment with reference of FIG. 11. FIG. 11 is a view of the semiconductor device taken at the opening part 12 of the probe card board 11. In FIG. 11, parts that are the same as the parts illustrated in drawings previously referred to are given the same reference numerals, and explanation thereof is omitted.

In the example illustrated in FIG. 11, plural circuit boards 50 where the probe needles 13 are connected are provided on the probe card board 11 in a step manner and substantially in parallel with the main surface of the probe card board 11 so as to stick out to a space part side of the neighboring opening parts 12.

Plural electrode terminals 55 are formed on the main surface of the circuit boards 50. The above-discussed probe needles 13 are connected to a designated number of the electrode terminals 55. The circuit boards 50 provided on the probe card board 11 and the electrode terminals 17 of the probe card board 11 are connected to each other so that, via the electrode terminals 55 where the probe needles 13 are not connected, the circuit boards 50 come in contact with each other and the circuit boards 50 and the probe card board 11 come in contact with each other.

Accordingly, the circuit boards 50 where the probe needles 13 are connected are electrically connected to the electrode terminals 17 of the probe card board 11 so as to be electrically connected to pin connecting terminal parts 18 via wirings formed in a surface layer or an inside layer of the probe card board 11.

In this example, the probe needles 13 are connected to the electrode terminals 17 formed on the rear surface of the probe card board 11.

In this example, as well as the first embodiment, the probe needles 13 pierce the resin part 19 made of epoxy resin or the like having adhesion so that head ends of the probe needles 13 are situated in positions coming in contact with the outside connection electrode terminals of the tested semiconductor element (LSI chip).

Thus, in this example, plural circuit boards 50 where the probe needles 13 are connected are provided on the probe card board 11 in a step manner and substantially in parallel with the main surface of the probe card board 11 so as to stick out to a space part side of the neighboring opening parts 12. Accordingly, it is possible to have plural circuit boards 50 without making a space between neighboring opening parts 12 large.

In a case where it is necessary to use a circuit board having a different circuit structure depending on the tested semiconductor element (LSI chip) which is a measurement subject (test subject), by properly selecting the circuit board 30, it is possible to perform measuring (testing) precisely for every tested semiconductor element (LSI chip) without arranging plural testing units with large separation.

In this example, the circuit boards 14, where the probe needles 13 are connected, are provided substantially perpendicular to the main surface of the probe card board 11. However, in this example, it is not always necessary to provide the circuit boards 14.

According to the above-discussed embodiments, it is possible to realize high measuring efficiency (testing efficiency) in a test of the plural semiconductor elements formed on a single semiconductor substrate (wafer). Hence, it is possible to provide the testing device of the semiconductor devices so that productivity of producing the semiconductor elements can be improved and the manufacturing cost can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A testing device of a semiconductor device, comprising:
a first board on which a plurality of discrete four-sided rectangular-shaped openings are arranged in an array and spaced with equal intervals among the plurality of discrete four-sided rectangular-shaped openings;
a frame body provided in the plurality of discrete four-sided rectangular-shaped openings, the frame body having a frame in which plural probe needles are provided; and
plural second boards respectively provided along four sides of external circumferential sides of the plurality of discrete four-sided rectangular-shaped openings while directing a part of faces of the plural second boards perpendicular to the other part of the faces of the plural second boards and further directing all the faces of the plural second boards perpendicular to the first board, the second boards being electrically connected to the first board,
wherein the probe needles pierce the frame so as to be electrically connected to the second boards from the periphery of the frame body via the plurality of discrete four-sided rectangular-shaped openings.

2. The testing device as claimed in claim 1,
wherein a testing terminal is provided in the periphery of the first board, the testing terminal being connected to the testing device; and
the testing terminal is electrically connected to the probe needles via a first wiring on the first board and a second wiring on the second board.

3. A testing device of a semiconductor device, comprising:
a first board on which a plurality of discrete four-sided rectangular-shaped openings are arranged in an array and spaced with equal intervals among the plurality of discrete four-sided rectangular-shaped openings;
a frame body provided in the plurality of discrete four-sided rectangular-shaped openings, the frame body having a frame in which plural probe needles are provided; and
plural second boards provided along any neighboring two sides of external circumferential sides of the plurality of discrete four-sided rectangular-shaped openings and perpendicular to the first board, the second boards being electrically connected to the first board,
wherein the probe needles pierce the frame so as to be electrically connected to the second boards from the periphery of the frame body via the plurality of discrete four-sided rectangular-shaped openings.

4. The testing device as claimed in claim 3,
wherein a testing terminal is provided in the periphery of the first board, the testing terminal being connected to the testing device; and
the testing terminal is electrically connected to the probe needles via a first wiring on the first board and a second wiring on the second board.

5. A testing device of a semiconductor device, comprising:
a first board on which a plurality of discrete four-sided rectangular-shaped openings are arranged in an array and spaced with equal intervals among the plurality of discrete four-sided rectangular-shaped openings;
a frame body provided in the plurality of discrete four-sided rectangular-shaped openings, the frame body having a frame in which plural probe needles are provided; and plural second boards provided along four sides forming a cross shape among the plurality of discrete four-sided rectangular-shaped openings of external circumferential sides of the plurality of discrete four-sided rectangular-shaped openings and perpendicular to the first board, the second boards being electrically connected to the first board, wherein the probe needles pierce the frame so as to be electrically connected to the second boards from the periphery of the frame body via the plurality of discrete four-sided rectangular-shaped openings.

6. The testing device as claimed in claim 5, wherein a testing terminal is provided in the periphery of the first board, the testing terminal being connected to the testing device; and the testing terminal is electrically connected to the probe needles via a first wiring on the first board and a second wiring on the second board.

* * * * *